United States Patent
Aboush et al.

(10) Patent No.: US 9,543,068 B2
(45) Date of Patent: Jan. 10, 2017

(54) INDUCTOR STRUCTURE AND APPLICATION THEREOF

(71) Applicant: QUALCOMM TECHNOLOGIES INTERNATIONAL, LTD., Cambridge (GB)

(72) Inventors: Zaid Aboush, Chandler, AZ (US); Adem Aktas, Chandler, AZ (US); Jeff Koeller, Mesa, AZ (US)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 194 days.

(21) Appl. No.: 14/306,911

(22) Filed: Jun. 17, 2014

(65) Prior Publication Data

US 2015/0364242 A1   Dec. 17, 2015

(51) Int. Cl.
| | |
|---|---|
| *H01F 27/29* | (2006.01) |
| *H01F 5/00* | (2006.01) |
| *H01F 27/28* | (2006.01) |
| *H01F 17/00* | (2006.01) |
| *H03L 7/099* | (2006.01) |

(Continued)

(52) U.S. Cl.
CPC ........ *H01F 17/0006* (2013.01); *H03B 5/1212* (2013.01); *H03B 5/1228* (2013.01); *H03B 5/1296* (2013.01); *H03F 1/223* (2013.01); *H03L 7/099* (2013.01); *H01F 2017/0073* (2013.01); *H03F 3/193* (2013.01);

(Continued)

(58) Field of Classification Search
CPC .............. H01F 27/2804; H01F 17/0006; H01F 17/0013; H01F 2017/0286; H01L 22/12
USPC ................................ 336/192, 200, 220, 222
See application file for complete search history.

(56) References Cited

U.S. PATENT DOCUMENTS 5,477,204 A * 12/1995 Li ....................... H01F 17/0006
                                                        336/200
5,497,137 A *  3/1996 Fujiki ................. H01F 17/0006
                                                        333/26

(Continued)

FOREIGN PATENT DOCUMENTS

EP        2863429 A1    4/2015
WO    2008014506 A2    1/2008

OTHER PUBLICATIONS

GB Search Report Issued in related GB Application No. 1506913.1, dated Nov. 23, 2015, 4 Pages.

*Primary Examiner* — Elvin G Enad
*Assistant Examiner* — Joselito Baisa
(74) *Attorney, Agent, or Firm* — Procopio, Cory, Hargreaves & Savitch LLP

(57) ABSTRACT

The present disclosure relates to composite inductor structures for use in integrated circuits. There is provided a composite inductor structure comprising a first inductor coil and a second inductor coil. The second inductor coil comprises a multi-turn loop that surrounds the first inductor coil. The first inductor coil comprises two multi-turn loops which are connected in a figure-of-eight configuration about a central terminal so as to cause a current flowing in a first loop of the multi-turn loops to circulate around the first loop in a first rotational direction, and a current flowing in a second loop of the multi-turn loops to circulate around the second loop in a second rotational direction opposite the rotational direction of current flow in the first loop, said direction of current flow in the first and second loops being mirror images of each other.

15 Claims, 6 Drawing Sheets

(51) Int. Cl.
  *H03B 5/12* (2006.01)
  *H03F 1/22* (2006.01)
  *H03F 3/193* (2006.01)

(52) U.S. Cl.
  CPC .... *H03F 2200/09* (2013.01); *H03F 2200/294* (2013.01); *H03F 2200/492* (2013.01); *H03F 2200/541* (2013.01)

(56) References Cited

U.S. PATENT DOCUMENTS

| | | | | |
|---|---|---|---|---|
| 5,777,538 A * | 7/1998 | Schuetz | | G21K 5/04 336/173 |
| 6,236,297 B1 * | 5/2001 | Chou | | H01F 17/0006 257/E27.046 |
| 7,057,488 B2 * | 6/2006 | Van Haaren | | H01L 27/08 257/E21.022 |
| 7,199,682 B2 * | 4/2007 | Ezzeddine | | H01F 5/003 333/177 |
| 7,432,794 B2 * | 10/2008 | Mattsson | | H01F 17/0006 257/E27.046 |
| 7,456,723 B2 * | 11/2008 | Maeda | | H01L 23/5227 257/E21.022 |
| 7,460,001 B2 * | 12/2008 | Jessie | | H01F 17/0006 257/E27.046 |
| 7,623,006 B2 * | 11/2009 | Ezzeddine | | H01P 5/185 333/112 |
| 7,864,014 B2 * | 1/2011 | Ezzeddine | | H03H 7/42 336/200 |
| 7,986,210 B2 * | 7/2011 | Gianesello | | H01F 17/0013 336/200 |
| 8,018,312 B2 * | 9/2011 | Kossel | | H03H 7/185 331/117 R |
| 8,344,841 B2 * | 1/2013 | Gertenbach | | H01F 27/346 336/173 |
| 8,427,388 B2 * | 4/2013 | Fahs | | H01F 17/0006 333/25 |
| 8,552,812 B2 * | 10/2013 | Yen | | H01L 23/5223 333/25 |
| 8,576,026 B2 * | 11/2013 | Liu | | H03H 7/09 333/204 |
| 8,576,039 B2 * | 11/2013 | Yoon | | 336/192 |
| 2004/0182602 A1 * | 9/2004 | Satoh | | H01F 17/0006 174/258 |
| 2011/0148733 A1 * | 6/2011 | Fahs | | H01F 17/0006 343/859 |
| 2011/0248809 A1 | 10/2011 | Gertenbach et al. | | |
| 2012/0244802 A1 | 9/2012 | Feng et al. | | |
| 2012/0326826 A1 | 12/2012 | Gertenbach et al. | | |

\* cited by examiner

*PRIOR ART*

PRIOR ART

INDUCTOR STRUCTURE AND APPLICATION THEREOF

TECHNICAL FIELD

This invention relates to inductor structures found in RF designs such as low noise amplifiers (LNA), power amplifiers (PA), and/or Voltage Controlled Oscillators (VCO). The present invention is particularly applicable to dual wideband VCOs.

BACKGROUND

Inductors are often used in integrated circuits, such as the voltage controlled oscillator 100 shown in FIG. 1. When multiple inductors L1 and L2 are present in such circuits, or in separate circuits on the same IC substrate, there is a risk that the inductors magnetically couple with each other, which, in turn, may affect the operation of the integrated circuit as the resulting currents induced in the components can cause unwanted changes in their behavioural characteristics. The location and proximity of these components is a factor in the degree of magnetic coupling present. To mitigate this problem, integrated circuits are often designed such that inductors are physically separated as far as is practical. However, such design topologies occupy a large area on chip and it is desirable to minimise the chip area required for an integrated circuit. Furthermore, it is desirable to conserve chip area without compromising the performance of the integrated circuit.

It has been proposed to reduce the area required by a circuit comprising more than one inductor by embedding an inductor within another. A design of an integrated inductor and transformer known in the art is illustrated in FIG. 2 (from US 2011/0248809 and US2012/0326826) where the inductor structure 200 includes a first inductor 201 and a transformer 202 comprising a second inductor 203 and a third inductor 204, in which the first inductor 201 is embedded within the transformer 202, such that the magnetic effect of a current flowing through the inductor 201 cancels that of the outer inductors 203 and 204 such that no magnetic coupling of these coils occurs. This cancellation of magnetic effect in FIG. 2 is due to the figure-of-eight configuration of the first inductor 201 such that the magnetic component generated by the current flowing in outer inductors 203 and 204 is removed, while at the same time said outer inductors 203 and 204 are interleaved to form the transformer 202.

A low noise amplifier (LNA) circuit 300 using the inductor structure 200 is shown in FIG. 3. The circuit 300 comprises several elements and includes inductor elements 201, 203 and 204. The circuit 300 shows how the first inductor 201 and outer inductors 203 and 204 of inductor structure 200 can be connected. It is clear from FIG. 3 that while the inductor structure 200 of FIG. 2 economises on chip area, the device does not have the functionality to operate all inductors as discrete isolated inductors that can be configured to operate independently or together as coils L2 and L3 cannot be decoupled from transformer 202 and used separately. Further, the outer inductors 203 and 204 (represented by coils L2 and L3) and the inner inductor 201 (represented by coil L1) do not share a common ground connection which balances the whole structure in which a node common to all of the coils is forced to specific potential where the common mode current through coils L1 to L3 can be controlled.

There is therefore a need for an improved integrated inductor structure that can be configured to operate as independent inductors, or as a composite inductor, as required by an integrated circuit, while minimising the occupied chip area and ensuring mutual isolation between the independent devices.

SUMMARY OF THE INVENTION

There is provided herewith a composite inductor structure comprising a first inductor coil and a second inductor coil, the second inductor coil comprising a multi-turn loop that surrounds the first inductor coil, and the first inductor coil comprising two mirror imaged multi-turn loops which are connected in a figure-of-eight configuration about a central terminal so as to cause current flowing in a first loop of the two mirror imaged multi-turn loops to circulate around the first loop in a first rotational direction, and a current flowing in a second loop of the two mirror imaged multi-turn loops to circulate around the second loop in a second rotational direction opposite to the rotational direction of current flow in the first loop, wherein the central terminal connects the first inductor coil to the second inductor coil such that the size of the first loop of the first inductor coil connected to the central terminal is equal to the size of the second loop of the first inductor coil connected to the central terminal.

In embodiments, the central terminal equally divides the loop of the second inductor coil.

In other embodiments, the first inductor coil is 180° rotationally symmetric about the central terminal.

In other embodiments, the central terminal is connected to a DC supply with a de-coupling capacitor or to a ground terminal.

In other embodiments, the electromagnetic fields generated by the currents circulating in the first and second loops of the first inductor coil induce electromagnetic currents in the second inductor coil wherein the magnitude and direction of these induced currents are such that they effectively cancel out.

In other embodiments, the first and second inductor coils may be operated independently, concurrently, or one at a time.

In other embodiments, the first and second loops of the first inductor structure, and the loop of the second inductor structure, each have a plurality of windings.

In other embodiments, the width of each of the windings of the first and second inductor coils is either varied or the same moving from the innermost winding to the outermost winding.

In other embodiments, the turns of the windings in the first and second inductor coils are separated by a spacing.

In other embodiments, the spacing is either varied or the same moving from the innermost winding to the outermost winding.

In other embodiments, for use in a dual-band voltage controlled oscillator, Low Noise Amplifier (LNA), and Power Amplifier (PA).

In other embodiments, the shape of the first and second inductor coils is one of: circular, octagonal or square.

In other embodiments, the central terminal connects the first and second coil using on either the same metal layer, or on different metal layers using corresponding vias structures.

In other embodiments, the first and second inductor coils are fabricated on the same layer within an integrated circuit.

In other embodiments, the first and second inductor coils are fabricated on different layers within an integrated circuit and are connected using via structures.

FIGURES

FIG. 6A illustrates the interconnections made between the integrated inductor structure of the present invention and two voltage controlled oscillators, while

DETAILED DESCRIPTION

Figure 1:
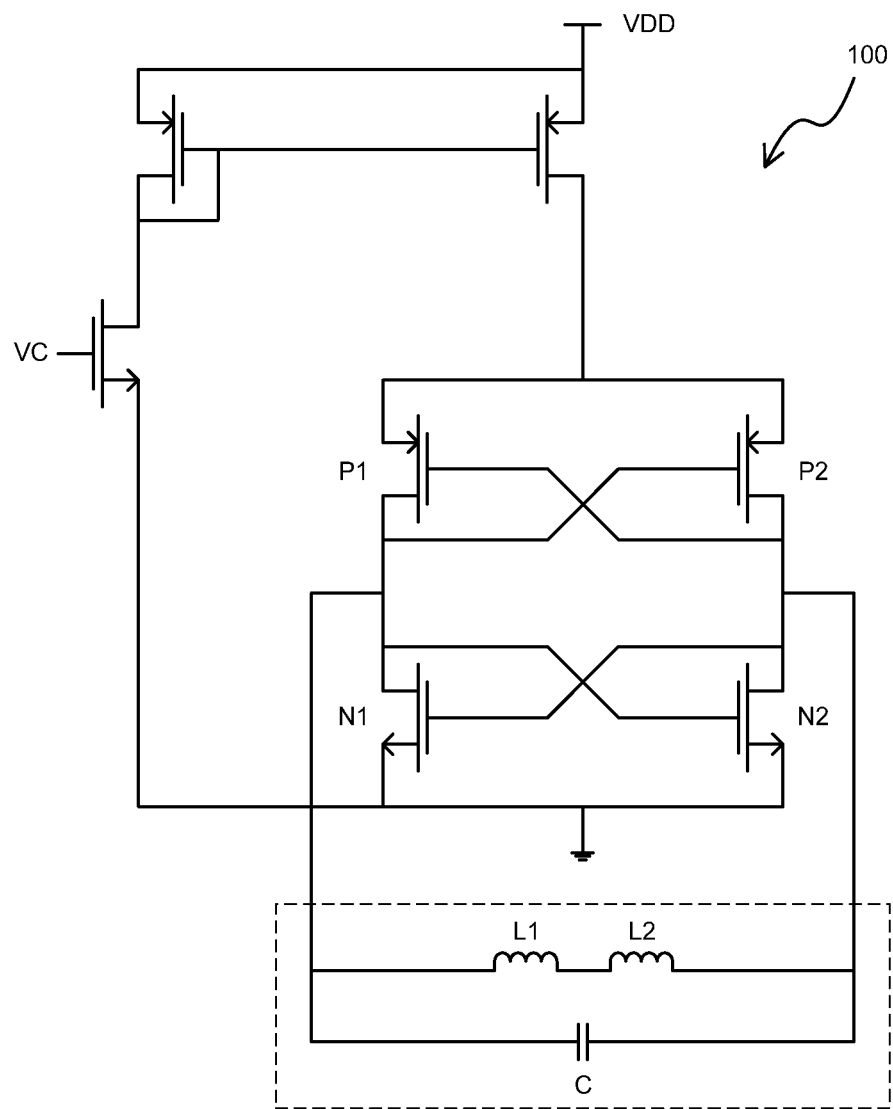
FIG. 1 illustrates a schematic circuit diagram of a voltage controlled oscillator known in the art.
Figure 2:
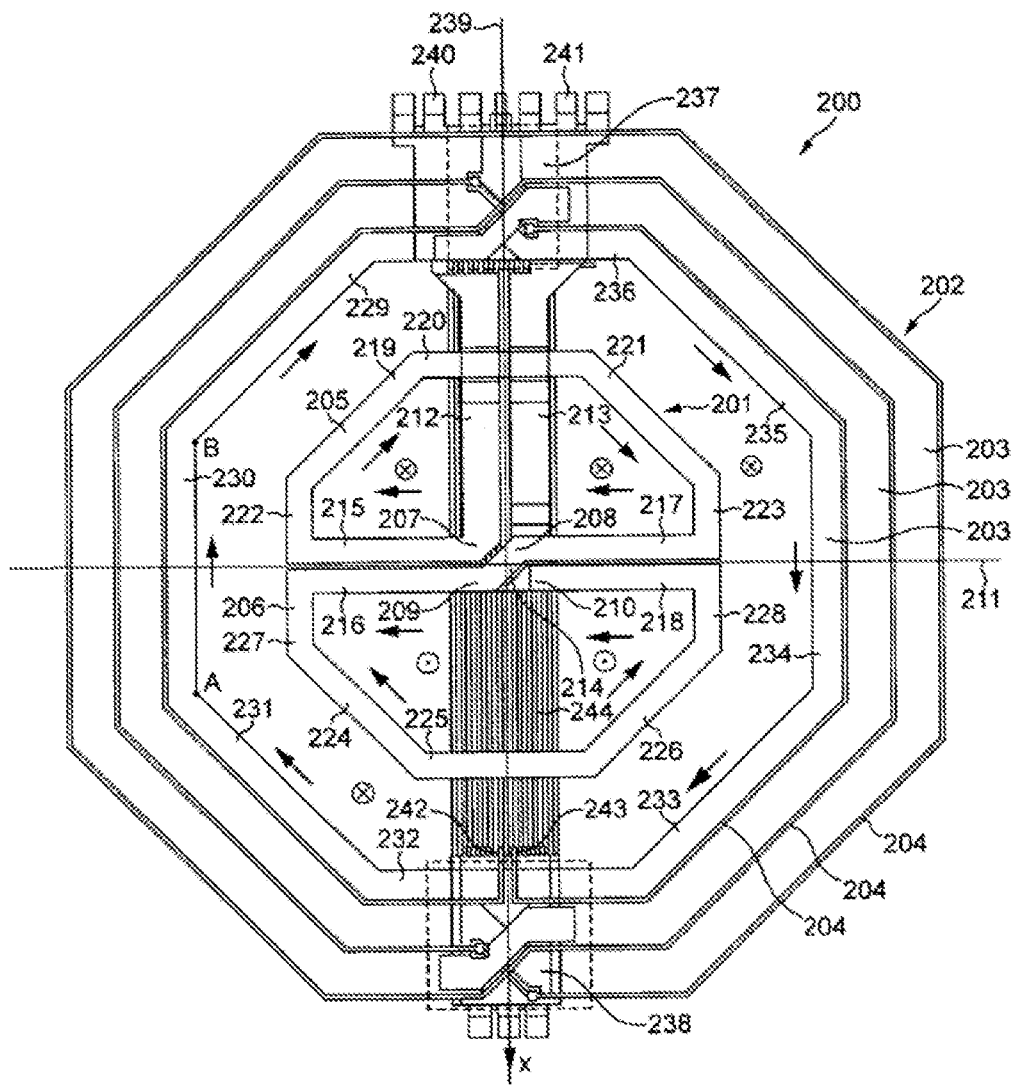
FIG. 2 depicts an integrated inductor and transformer structure known in the art.
Figure 3:
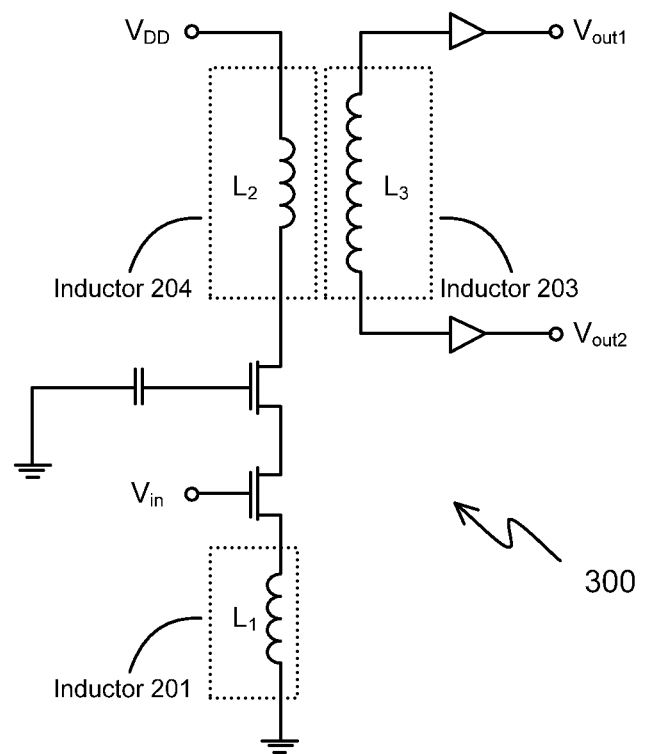
FIG. 3 illustrates an LNA circuit diagram using the integrated inductor and transformer structure of FIG. 2.
Figure 4:
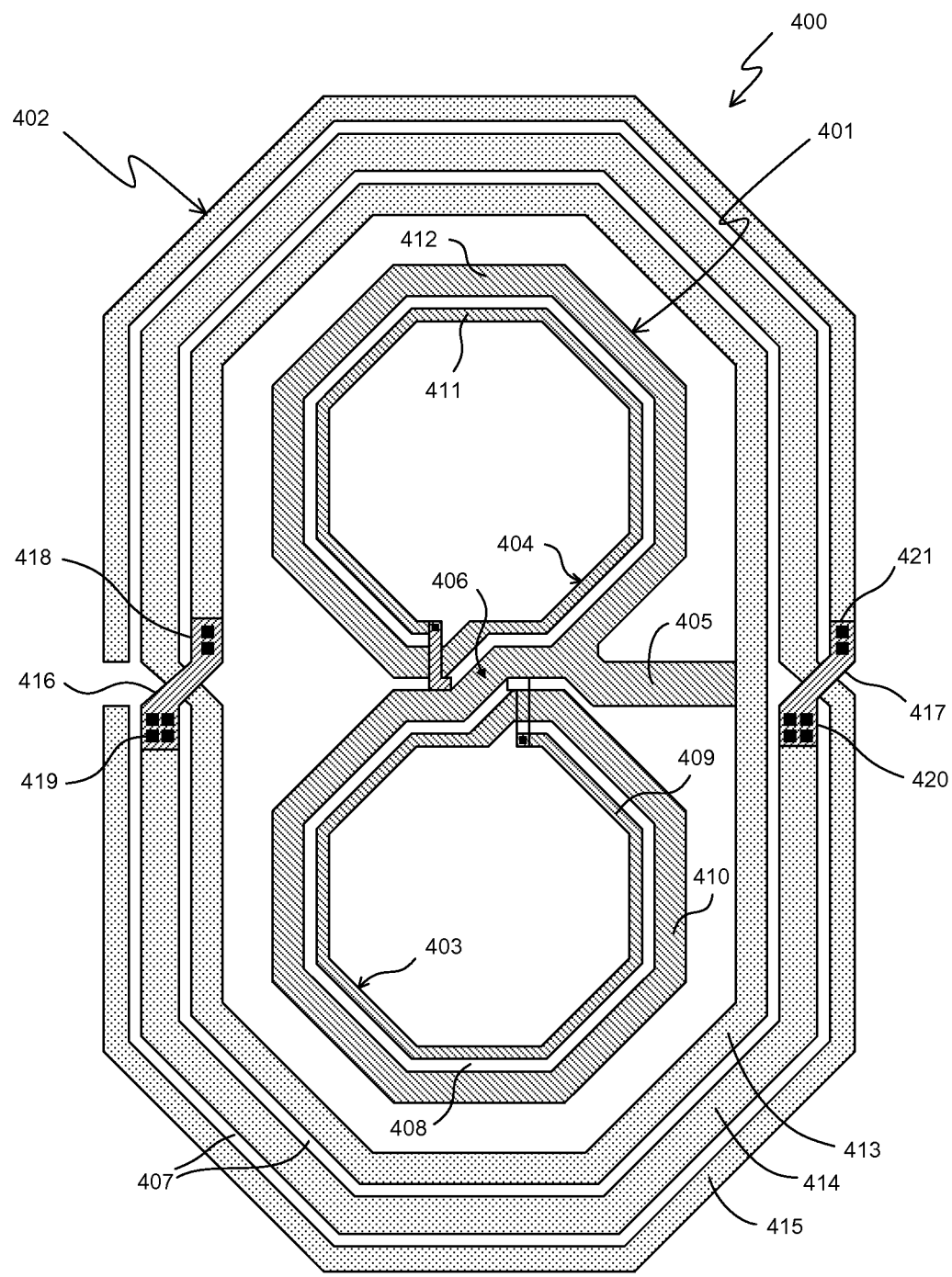
FIG. 4 depicts the dual-band integrated inductor structure according to an embodiment of the present invention.

FIG. 4 shows a schematic diagram of a dual-band IC inductor structure 400 according to an embodiment of the present invention for use in system-on-chip (SoC) integrated circuits such as Voltage Controlled Oscillators (VCO). The dual-band inductor 400 of FIG. 4 is fabricated using known integrated circuit fabrication technology.

The dual-band inductor structure 400 comprises a first inductor coil 401 and a second inductor coil 402. The first inductor coil 401 comprises a first loop 403 and a second loop 404 connected in a figure-of-eight arrangement. The second inductor coil 402 comprises a loop that encloses the first inductor coil 401. In the example of FIG. 4 the first inductor coil 401 may take any shape. Preferably, the first 403 and second 404 loops of the first inductor coil 401, and the second inductor coil 402, are octagonal. Alternatively, the first 401 and second 402 inductor coils are either circular or square shaped. With this arrangement, the dual-band inductor structure 400 of FIG. 4 utilises one coil space or area set by the size of the second inductor coil 402. Hence the area occupied by the first inductor coil 401 is inherent and thus effectively 'comes free', thereby maximising utilisation of silicon area in an IC.

The dual-band inductor structure 400 of the present invention can be utilised in multi-band VCOs. When used in a dual-band VCO, the size of the first inductor coil 401 determines the higher frequency band of the VCO while the size of the second inductor coil 402 determines the lower frequency band of the VCO. The lower frequency band (determined by inductor 402) of the VCO dictates the size of the dual-band inductor structure 400 and the coil 401 for the higher frequency band does not require additional area because it is enclosed inside the low frequency band coil 402. Thus when designing the dual-band inductor structure 400 of the present invention, the coil 401 is designed first for the required inductance value and Q-factor. The coil 402 is then optimised independently for the required parameters and embedded around the coil 401. The second coil 402 is then fine-tuned when it surrounds the first coil 401 to account for any changes in performance due to the first coil 401.

The first loop 403 and the second loop 404 of the first inductor coil 401, and the loop of the second inductor coil 402 are connected to a central terminal 405 within the inductor structure. In an embodiment of the present invention, terminal 405 is the physical RF ground terminal of the inductor structure 400. In the example of FIG. 4, excluding terminal 405, the first inductor coil loops 403 and 404 are configured such that they are rotationally symmetric about point 406 as shown in FIG. 4. This symmetry ensures that the magnetic effects of these coils are matched and thus cancel out.

In an embodiment of the present invention, inductor coils 401 and 402 are fabricated on the same layer within an integrated circuit structure. Alternatively, inductors 401 and 402 may be located on separate layers. Further, in the embodiment shown in FIG. 4, central terminal 405 is formed by an extension of the material used for the first loop 403 and the second loop 404 of the first inductor coil 401. However it will be appreciated that this terminal may alternatively be implemented in other ways (for example, on a different layer to that containing the first 401 and second 402 inductor coils, connected to said coils with a via).

Each of the turns 409 to 415 of the windings in the first 401 and second 402 inductor coils are separated from each other by spacing 408 for the first inductor 401 and spacing 407 for the second inductor 402. In an embodiment of the present invention, the width of each of the windings 409 to 415 and the spacing 407 and 408 between said windings are the same. Alternatively, these dimensions 407 to 415 may vary within each of the inductors 401 and 402 to attain a target inductance and/or Q-factor to optimise performance.

The dual-band inductor structure described herein before may (i) reduce the required area, (ii) allow the coils to operate independently, and concurrently as a single stand-alone inductor, and (iii) allow the use of an effective single S-parameter model where coupling between coils can be included and optimised.

It is worth noting that the Q-factor is a representation of the losses in the coil due to the electromagnetic field distribution resulting from its unique structure. In the structure of FIG. 4, the first (inner) inductor coil 401 has a certain loss; when this inner coil 401 is surrounded by the second (outer) inductor coil 402, the electromagnetic fields coupled from the outer coil 402 to the inner coil 401 will be subject to the losses of the inner coil 401. Hence the lowest Q-factor inductor coil will dominate the structure performance.

The coupling between the inner and outer coils can be reduced by pushing the outer coil 402 out and away from the inner coil 401. Figure-of-eight coils have lower Q-factor than corresponding coils of standard design. Thus in the embodiment depicted in FIG. 4, the inner coil 401 has a lower Q-factor than the outer coil 402. However, the reduction in Q-factor is more than compensated for by the reduction of area occupied by the integrated coils.

In the foregoing description, the inductance of each coil can be set independently from each other while the Q-factor of either coil is set by the minimum Q-factor of either coil.

In an exemplary embodiment of the present invention, the width of the windings 409 and 410 of the first inductor coil 401 increases outwards from 3 µm to 7 µm, and the widths of the windings 413 to 415 of the second inductor coil 402 are 8 µm, 9 µm and 6 µm, respectively, moving outwards. In both inductors, the respective windings are separated by a spacing 407 and 408 of 3 µm. In this exemplary embodiment, the coil 402 has a Q-factor of >15 when no coil is embedded inside it and the coil 401 has Q-factor of >13 when no coil is surrounding it. Combining both the coils in the dual-band inductor structure 400 of FIG. 4, a Q-factor of 13 for the coil 401 and 12.7 for the coil 402 is achieved. In one embodiment of the present invention, the coil 401 is designed to work optimally at 10 GHz and the coil 402 is designed to work optimally at 4 GHz.

It should be noted that due to the skin depth effect, the current usually flows in the side walls of the coil trace. Hence the dimensions of features 407 to 415 will determine the self and mutual inductance inside the inductor structure 400. Coils with wider turns have more electric field coupling (the capacitive effect); thus using this capacitive element, it is possible to tune and optimise the self resonance frequency of the inductor which, in turn, will shift the Q-factor peak and change the inductance value accordingly.

Notably, in an embodiment of the present invention, the turns of the windings 413 to 415 and of the outer inductor coil 402 are discontinuous and are connected so as to form a continuous structure; this connection is facilitated by crossover sections 416 and 417 fabricated on a different layer to the windings and connected thereto by vias 418 to 421.

In a further embodiment of the present invention, the first inductor coil 401 is continuous due to the loops 403 and 404 of its figure-of-eight structure. Alternatively, in a further embodiment, the first inductor coil 401 may have windings that are discontinuous similar to that of the second inductor coil 402. In another embodiment, the second inductor coil 402 may have windings that are continuous similar to that of the first inductor coil 401 of the present invention.

In the configuration of FIG. 4, inductor coils 401 and 402 can function as two independent inductor coils placed one within another that can be used independently and/or at the same time without affecting the electrical performance of either coil while sharing a common centre-tap point 405. In one embodiment, this centre-tap point is an AC ground reference.

Figure 5:
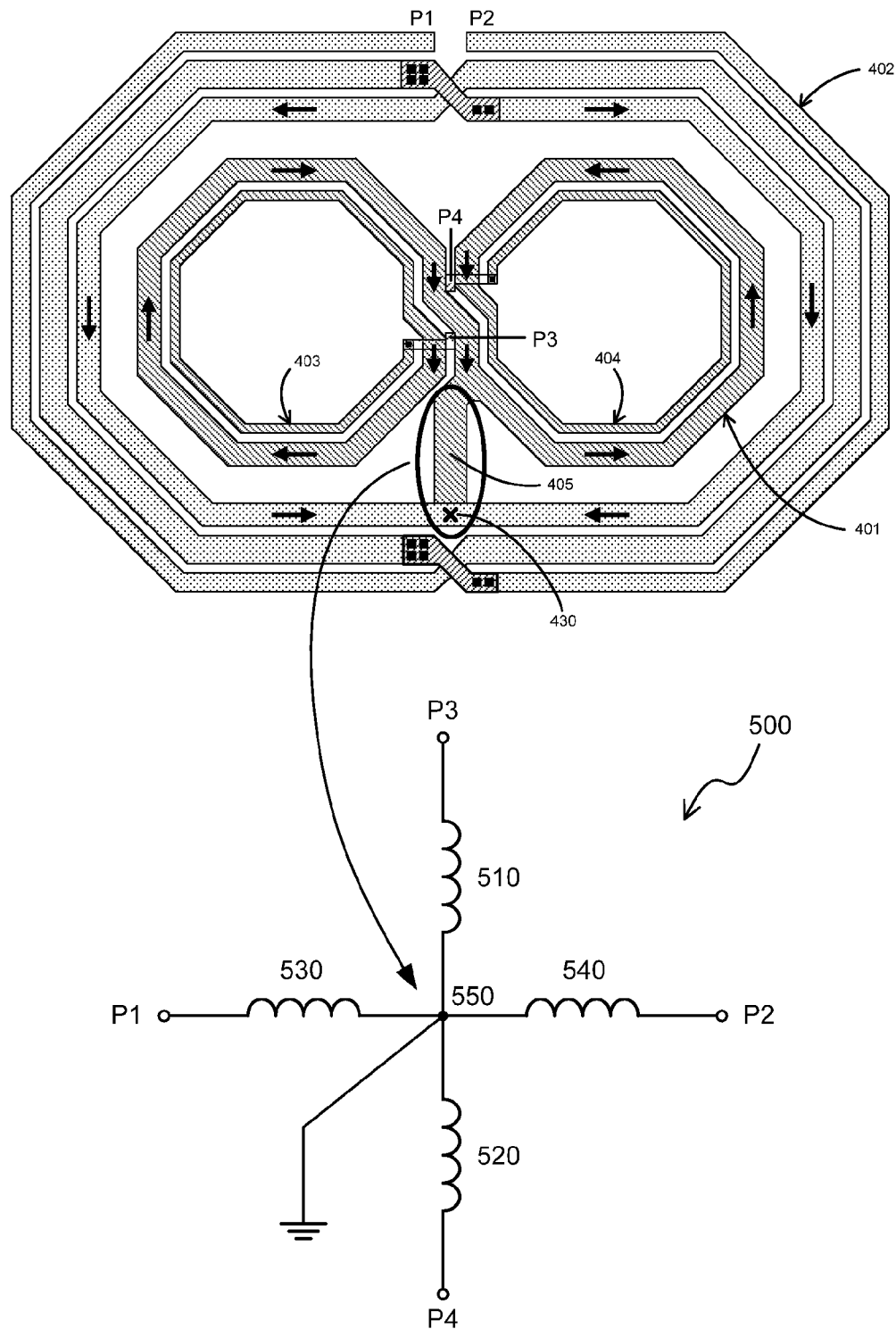
FIG. 5 illustrates the equivalent circuit diagram of the integrated inductor structure of FIG. 4 according to an embodiment of the present invention.

The equivalent circuit 500 of the inductor structure 400 is shown in FIG. 5. The first inductor coil 401 is represented by identical equivalent inductors 510 and 520 and the second inductor coil 402 is represented by identical inductors 530 and 540. Each of these inductors in the equivalent circuit 500 have one point connected to a common centre-tap point 550 and the other point connected to input terminals P1, P2, P3 and P4 in a star configuration, thereby effectively forming a five port passive device. The centre-tap point 550 in FIG. 5 is physically realised by the central terminal 405 in FIG. 4.

During use of the inductor structure 400, alternating current flows in the first inductor 401 via terminal P3 through to terminal P4 as shown in FIG. 5. Due to the figure-of-eight structure of first inductor 401, during a first cycle of AC operation, the current flows in a clockwise direction in loop 403 and an anti-clockwise direction in loop 404; these directions of current flow are also illustrated in FIG. 5. As loops 403 and 404 in the first inductor 401 are equal in size and shape, the electromagnetic fields generated by the currents travelling in each of loops 403 and 404 induce electromagnetic far field currents in the outer coil 402; these induced currents are equal in magnitude but opposite in direction, thus effectively cancelling each other out. Further, the current flowing in the inner coil 401 will induce current flow in the outer coil 402 due to electromagnetic near field coupling between these structures. Thus, an (induced) current will physically flow in the outer coil 402 and shortly get cancelled out at the mid-point 430 of outer coil 402 (labelled 'X' in FIG. 5). Thus, when the coils 401 and 402 are used at the same time, no additional insulating means (such as active switches) are required to isolate the coils 401 and 402 from each other. The reverse would occur during a second, opposite, cycle of AC operation.

The centre-tap point 550 enables the coils 401 and 402 to be utilised independently, concurrently or one at a time.

Figure 6A:
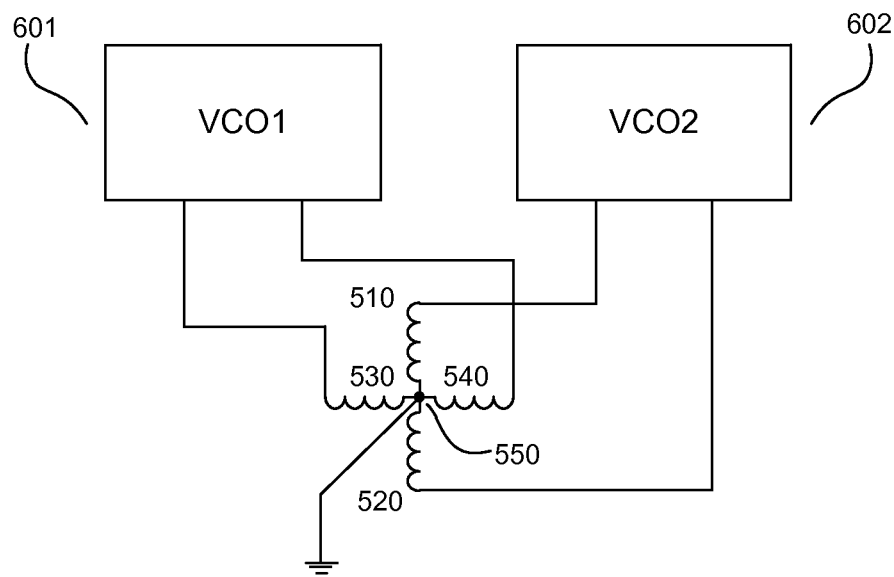
Figure 6B:
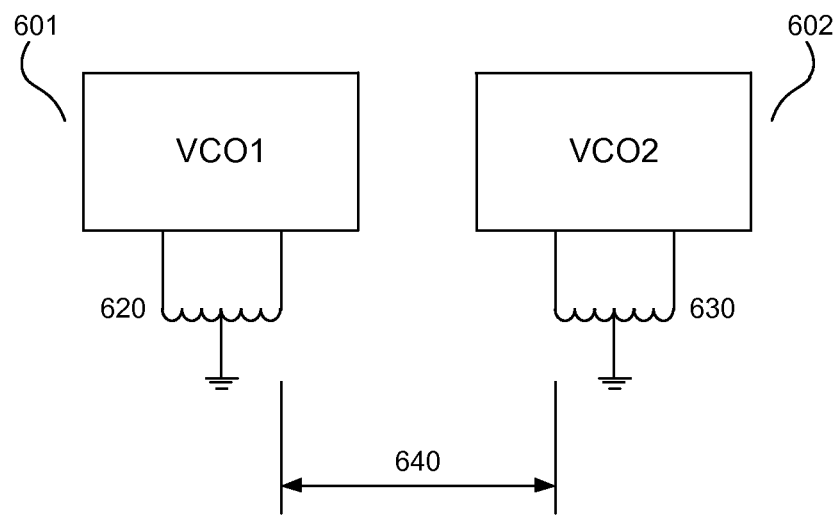
FIG. 6B depicts VCOs connected to two separate coils in a conventional arrangement.

The dual-band inductor coil 400 of the present invention can be utilised in two oscillators 601 and 602 using the connection terminals P1 to P4 of the dual-band inductor coil 400, as shown in FIG. 6A. This configuration removes the need for two separate coils 620 and 630, each of which takes up area on a chip. Due to the isolation provided between the first inductor coil 401 and the second inductor coil 402 in the dual-band structure 400, the proposed dual-band VCO 600 avoids interaction between the two coils during use. This is beneficial compared to using separate coils (such as coils 620 and 630 as shown in FIG. 6B) for each of VCO1 and VCO2. Even if the coils are widely separated (thus consuming large areas), some mutual coupling occurs and has to be factored into the design (such as ensuring a minimum separation 640 between coils).

The inductor structure 400 of the present invention allows VCO1 and VCO2 to be connected to coils 401 and 402 via terminals P1 to P4 as shown in FIG. 4, and can operate concurrently, independently or one at a time. As no active switches are required to isolate embedded coils 401 and 402, a high Q-factor can be maintained for both VCO1 and VCO2. Furthermore, the centre-tap point 550 provides a common DC feed and AC ground point which reduces supply routing on the IC should these oscillators be implemented separately.

In a further embodiment, the embedded coil configuration of the present invention can be used for radio frequency (RF) circuits such as low noise amplifiers (LNA) in addition to the dual VCO application discussed above.

In the foregoing, the term 'size' may take on the meaning of length. Thus in the context of the present inductor structure, the term 'size' would refer to the length of the metal conductor used to form the respective coil of the structure.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A five-terminal passive device for use in integrated circuits, the device comprising:
   a first inductor coil comprising
      a first loop connected to a first terminal and a central terminal, and
      a second loop connected to a second terminal and the central terminal,
      wherein the first loop and the second loop are configured in a figure-of-eight so that a current flowing in the first inductor coil circulates around the first loop in a first rotational direction and circulates around the second loop in a second rotational direction opposite the first rotational direction; and
   a second inductor coil comprising a loop that surrounds the first inductor coil,
   wherein a first end of the second inductor coil connects to a third terminal,
      a second end of the second inductor coil connects to a fourth terminal, and
      a midpoint of the second inductor coil connects to the central terminal.

2. The device of claim 1, wherein the first inductor coil is 180° rotationally symmetric about a symmetry point.

3. The device of claim 1, wherein electromagnetic fields generated by currents circulating in the first inductor coil induce electromagnetic currents in the second inductor coil having magnitudes and directions such that the induced electromagnetic currents effectively cancel out.

4. The device of claim 1, wherein the loop of the second inductor coil has a plurality of turns.

5. The device of claim 4, wherein widths of the turns the loop of the second inductor coil vary moving from an innermost turn to an outermost turn.

6. The device of claim 4, wherein the turns of the loop of the second inductor coil are separated by a spacing.

7. The device of claim 6, wherein the spacing varies moving from an innermost turn to an outermost turn.

8. The device of claim 1, wherein the first loop of the first inductor coil is octagonal, second loop of the first inductor coil is octagonal, and the loop of the second inductor coil is octagonal.

9. The device of claim 1, wherein the first loop of the first inductor coil, the second loop of the first inductor coil, and the loop of the second inductor coil are fabricated using a same metal layer within an integrated circuit.

10. The device of claim 1, wherein the first loop of the first inductor coil has a plurality of turns and the second loop of the first inductor coil has a plurality of turns.

11. The device of claim 10, wherein widths of the turns of the first loop of the first inductor coil vary moving from an innermost turn to an outermost turn, and wherein widths of the turns the second loop of the first inductor coil vary moving from an innermost turn to an outermost turn.

12. The device of claim 10, wherein the turns of the first loop of the first inductor coil are separated by spacings that vary moving from an innermost turn to an outermost turn, and wherein the turns of the second loop of the first inductor coil are separated by spacings that vary moving from an innermost turn to an outermost turn.

13. A oscillator circuit, comprising:
  a five-terminal passive device comprising
    a first inductor coil comprising a first loop connected to a first terminal and a central terminal and a second loop connected to a second terminal and the central terminal, wherein the first loop and the second loop are configured in a figure-of-eight so that a current flowing in the first inductor coil circulates around the first loop in a first rotational direction and circulates around the second loop in a second rotational direction opposite the first rotational direction, and
    a second inductor coil comprising a loop that surrounds the first inductor coil, wherein a first end of the second inductor coil connects to a third terminal, a second end of the second inductor coil connects to a fourth terminal, and a midpoint of the second inductor coil connects to the central terminal;
  a first voltage-controlled oscillator circuit coupled to the first terminal and the second terminal of the five-terminal passive device; and
  a second voltage-controlled oscillator circuit coupled to the third terminal and the fourth terminal of the five-terminal passive device.

14. The oscillator circuit of claim 13, wherein the central terminal is connected to an AC ground.

15. The oscillator circuit of claim 13, wherein the first voltage-controlled oscillator circuit and second voltage-controlled oscillator circuit are operated concurrently without interaction.

* * * * *